United States Patent [19]
Hong et al.

[11] Patent Number: 5,627,469
[45] Date of Patent: May 6, 1997

[54] SEPARATION OF FAT AND WATER MAGNETIC RESONANCE IMAGES

[75] Inventors: Xiaole Hong, Acton; Douglas A. C. Kelley, North Andover; Jianyu Lian, Cambridge; Peter B. Roemer, North Andover; Robert M. Weisskoff, Marblehead, all of Mass.

[73] Assignee: Advanced Mammography Systems, Inc., Wilmington, Mass.

[21] Appl. No.: 509,538

[22] Filed: Jul. 31, 1995

[51] Int. Cl.$^6$ .................................................. G01R 33/48
[52] U.S. Cl. ........................................ 324/309; 128/653.2
[58] Field of Search .................................. 324/307, 309, 324/300, 311, 312; 128/653.2, 653.5

[56] References Cited

U.S. PATENT DOCUMENTS

| | | | |
|---|---|---|---|
| 4,628,264 | 12/1986 | Rzedzian | 324/322 |
| 4,661,775 | 4/1987 | Kormos et al. | 324/307 |
| 4,714,885 | 12/1987 | Paltiel et al. | 324/312 |
| 4,720,679 | 1/1988 | Patrick et al. | 324/309 |
| 4,823,085 | 4/1989 | Fuderer et al. | 324/309 |
| 4,857,847 | 8/1989 | Machida | 324/311 |
| 4,871,967 | 10/1989 | Rotem | 324/309 |
| 4,949,042 | 8/1990 | Kuhara et al. | 324/309 |
| 5,051,699 | 9/1991 | Hanawa et al. | 324/309 |
| 5,099,207 | 3/1992 | Luyten | 324/309 |
| 5,113,865 | 5/1992 | Maeda et al. | 324/307 |
| 5,125,407 | 6/1992 | Harms et al. | 324/309 |
| 5,134,372 | 7/1992 | Inoue | 324/309 |
| 5,144,235 | 9/1992 | Glover et al. | 324/309 |
| 5,162,737 | 11/1992 | Nozokido et al. | 324/309 |
| 5,187,439 | 2/1993 | Jensen et al. | 324/309 |
| 5,202,631 | 4/1993 | Harms et al. | 324/309 |
| 5,250,899 | 10/1993 | Listerud et al. | 324/309 |
| 5,256,967 | 10/1993 | Foo et al. | 324/311 |
| 5,270,652 | 12/1993 | Dixon et al. | 324/309 |
| 5,285,161 | 2/1994 | Rzedzian et al. | 324/322 |
| 5,289,126 | 2/1994 | Mori et al. | 324/309 |
| 5,321,359 | 6/1994 | Schneider | 324/307 |
| 5,404,882 | 4/1995 | Santyr | 128/653.2 |
| 5,497,773 | 3/1996 | Kuhara et al. | 324/318 |

OTHER PUBLICATIONS

Dixon, "Simple Proton Spectroscopic Imaging," Radiology 153:189–194 (1984).
Glover, "Multipoint Dixon Technique for Water and Fat Proton and Susceptibility Imaging," JMRI 1:521–530 (1991).
Glover et al., "Three–Point Dixon Technique for True Water/Fat Decomposition with $B_o$ Inhomogeneity Correction," Magnetic Resonance in Medicine 18:371–383 (1991).
Sepponen et al., "A Method for Chemical Shift Imaging: Demonstration of Bone Marrow Involvement with Proton Chemical Shift Imaging," Journal of Computer Assisted Tomography 8(4):585–587 (1984).

*Primary Examiner*—Sandra L. O'Shea
*Assistant Examiner*—Raymond Y. Mah
*Attorney, Agent, or Firm*—Fish & Richardson P.C.

[57] ABSTRACT

To generate a magnetic resonance image of a region comprised of two species of nuclei that have non-identical Larmor frequencies, the nuclei are excited and two read-out gradient pulses are generated. The relative phase offset between the two species of nuclei is different at the center of the first pulse than at the center of the second pulse. Data acquired during the two read-out pulses are processed in accordance with these relative phase offsets.

27 Claims, 3 Drawing Sheets

Microfiche Appendix Included
(1 Microfiche, 46 Pages)

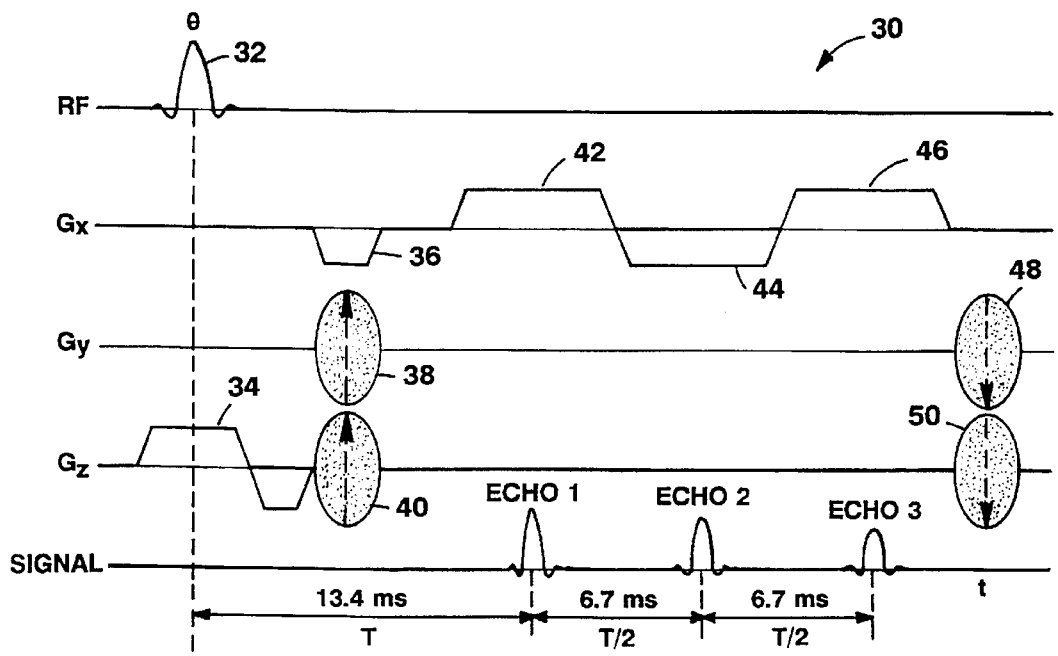
FIG. 2
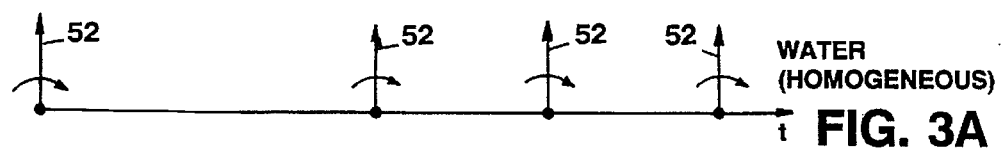
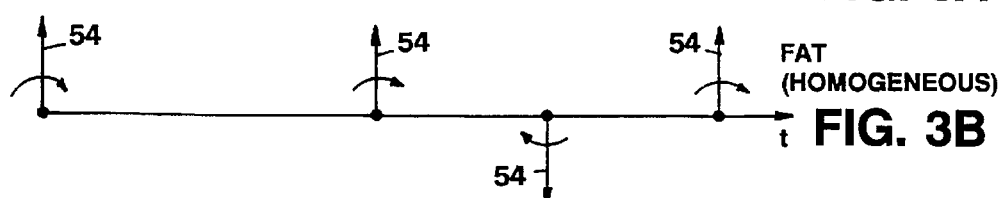
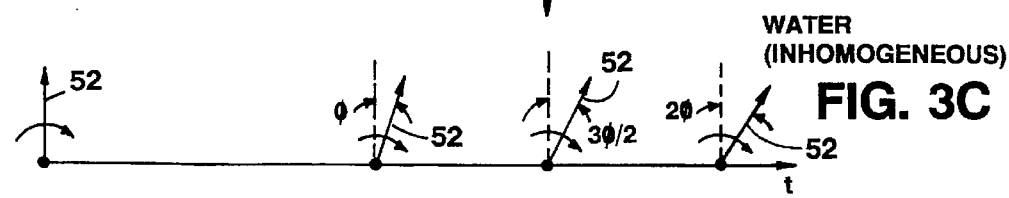
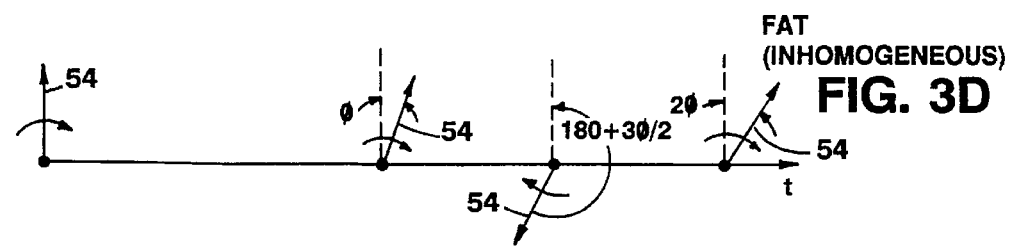

SEPARATION OF FAT AND WATER MAGNETIC RESONANCE IMAGES

REFERENCE TO MICROFICHE APPENDIX

A microfiche appendix forms part of this application. The appendix, which includes a source code listing of an embodiment of the invention, includes 46 frames on 1 microfiche.

This patent document (including the microfiche appendix) contains material that is subject to copyright protection. The copyright owner has no objection to the facsimile reproduction by anyone of the patent document as it appears in the Patent and Trademark Office file or records, but otherwise reserves all copyright rights whatsoever.

BACKGROUND OF THE INVENTION

The invention relates to magnetic resonance imaging (MRI) pulse sequences and data processing.

MRI generally involves subjecting an object (e.g., a region of the human body) to a magnetic field, exciting nuclei in the object using an RF signal, and using the RF resonance signals emitted by the excited nuclei to generate an image of the object or a region thereof.

When excited, a nucleus at a point (x,y,z) resonates at a "Larmor" frequency f that depends on the strength of the local magnetic field B(x,y,z):

$$f(x,y,z) = \gamma B(x,y,z) \qquad (1)$$

$\gamma$, the gyromagnetic ratio, is constant for a particular element in a particular compound. Because of the abundance of water in the human body, medical MRI typically images using hydrogen nuclei in water, which have a gyromagnetic ratio $\gamma$ of 4.258 kHz/Gauss (42.58 MHz/Tesla) Thus, in a 0.5 Tesla magnetic field, the Larmor resonant frequency $f_w$ of hydrogen nuclei in water is approximately 21.3 MHz.

Certain regions of tissue, such as a female breast, include relatively large volumes of intermixed fat and water. For a magnetic field of a given strength, the Larmor resonant frequency of a hydrogen nucleus in fat, $f_f$, is 3.5 parts per million ("ppm") less than the resonant frequency of a hydrogen nucleus in water. Thus, a fat hydrogen nucleus in a 0.5 Tesla field resonates at a frequency that is 74.5 Hz lower than the resonant frequency of a water hydrogen nucleus.

As explained for example in U.S. Pat. No. 4,628,264, incorporated herein by reference in its entirety, a typical MRI system generates a magnetic field that varies in strength both spatially and temporally. The resonant frequency of a particular excited nucleus therefore depends on the location of that nucleus within the object being imaged. The MRI system exploits this dependence between resonant frequency and position to reconstruct an image from the sensed RF signal emitted by the excited nuclei.

SUMMARY OF THE INVENTION

One aspect of the invention concerns a method and apparatus for generating a magnetic resonance image of a region comprised of two species of nuclei that have non-identical Larmor frequencies. After the nuclei are excited, two read-out gradient pulses are generated. The relative phase offset between the two species of nuclei is different at the center of the first pulse than at the center of the second pulse. Data acquired during the two read-out pulses are processed in accordance with these relative phase offsets.

By timing the read-out gradient pulses in this manner in accordance with the relative phase offset between the two species, the data collected during the pulses can be processed to generate two images. One image depicts the distribution of one of the species (e.g., water) in the object, and the other depicts the distribution of the other species (e.g., fat). This allows a diagnostic analyst (e.g., a radiologist) to assess the structure of just the water-bearing regions of the object being imaged, without the distraction of a superimposed image of the fat-bearing regions.

In addition, both read-out gradient pulses are generated after the same RF excitation pulse. A complete set of data can therefore be acquired in less time than would be necessary if only a single read-out gradient pulse followed each RF excitation pulse. Shortening the data acquisition period reduces not only patient discomfort, but also the chance that the tissue being imaged will shift during the acquisition, possibly resulting in a blurred and unusable image.

Embodiments of the invention, may include one or more of the following features.

In a particularly useful embodiment, the relative phase offset at the center of the first read-out gradient pulse (which occurs $N/(f_f-f_w)$ seconds after the center of the RF excitation pulse, where N is a positive integer and $f_f$ and $f_w$ are in Hertz) is substantially zero. The relative phase offset at the center of the second read-out gradient pulse (which occurs $(M+\frac{1}{2})/(f_f-f_w)$ seconds after the center of the first read-out gradient pulse, where M is a positive integer) is substantially 180°. A third read-out gradient pulse is generated after the other two. The relative phase offset at the center of this third pulse (which occurs $(P+\frac{1}{2})/(f_f-f_w)$ seconds after the center of the second read-out gradient pulse, where P is a positive integer), is substantially zero. Data collected during this third pulse can be used to scale the data collected during the second pulse, as well as to correct for phase shifts attributable to inhomogeneities in the main magnetic field.

The RF resonant signals emitted by the excited nuclei are acquired (e.g., digitized, sampled, and stored in respective raw data matrices) during the three read-out gradient pulses. The acquired RF resonant signals are then processed to generate a magnetic resonance image. Prior to Fourier transforming the RF resonant signals to generate images, DC bias is removed from the raw data, and some of the data are time-reversed.

After Fourier transformation, the magnitude and phase of the image data are corrected. Magnitude correction compensates for the exponential $T_2^*$ magnitude decay. Phase correction compensates for phase errors attributable to: (1) an echo center that does not lie in the center of the raw data matrix; (2) inhomogeneities in the static magnetic field; and (3) system timing-related imperfections.

Other advantages and features will become apparent from the following description of the preferred embodiments and from the claims.

BRIEF DESCRIPTION OF THE DRAWINGS

FIG. 2 is a timing diagram showing pulses used in an MRI sequence.

FIG. 3A is a schematic showing the orientation of a water hydrogen nucleus at various times during the MRI sequence shown in FIG. 2.

FIG. 3B is a schematic showing the orientation, with respect to the water hydrogen nucleus shown in FIG. 3A, of a fat hydrogen nucleus in a homogeneous magnetic field at various times during the MRI sequence shown in FIG. 2.

FIG. 3C is a schematic showing the orientation, with respect to the water hydrogen nucleus shown in FIG. 3A, of a water hydrogen nucleus in an inhomogeneous magnetic field at various times during the MRI sequence shown in FIG. 2.

FIG. 3D is a schematic showing the orientation, with respect to the water hydrogen nucleus shown in FIG. 3A, of a fat hydrogen nucleus in an inhomogeneous magnetic field at various times during the MRI sequence shown in FIG. 2.

DESCRIPTION OF THE PREFERRED EMBODIMENTS

Figure 1:
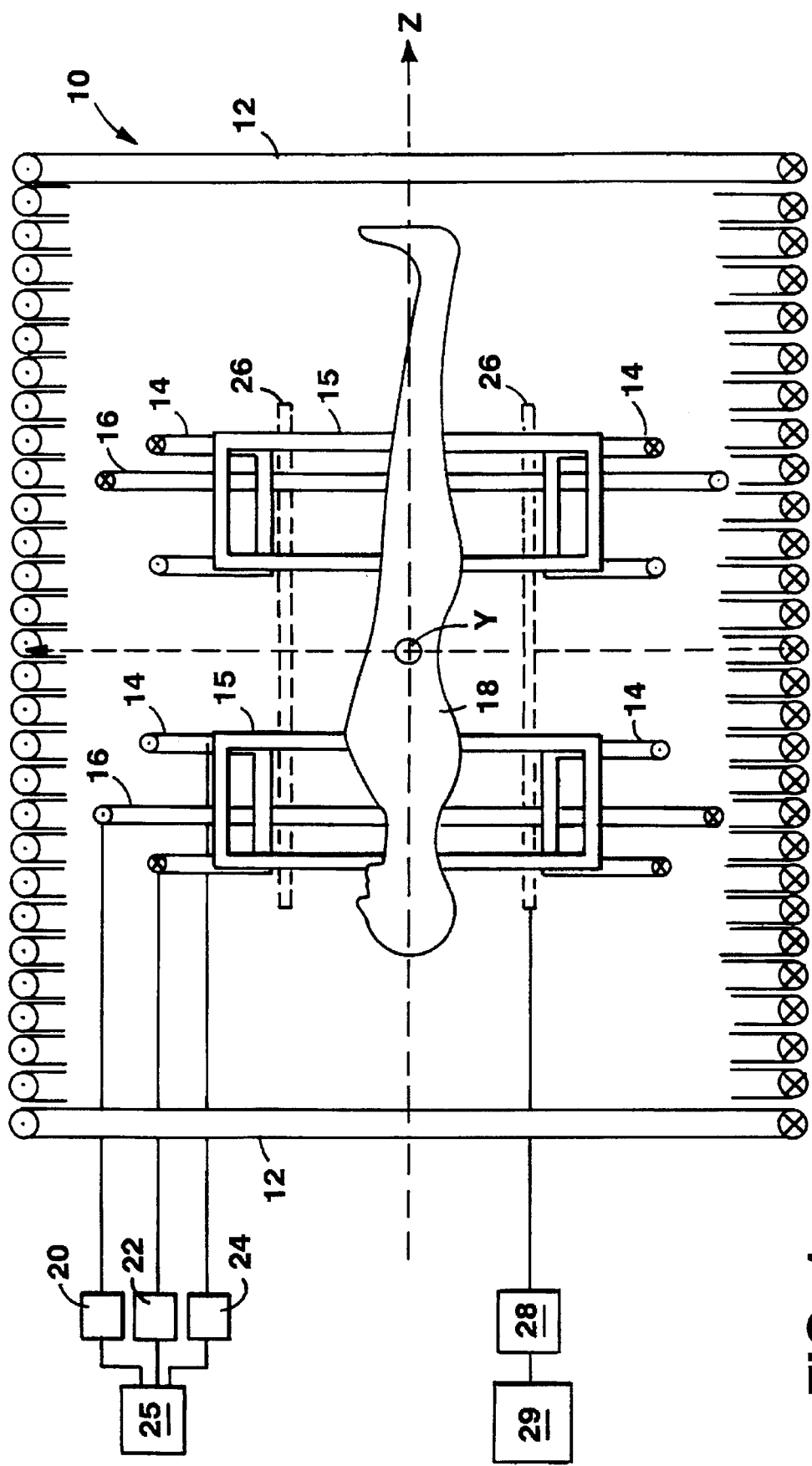
FIG. 1 is a cross-sectional, diagrammatic view of an arrangement of MRI coils around a subject body.

As shown in FIG. 1, an MRI system 10 includes a whole-body coil 12 oriented in relation to x, y, and z axes. As described in U.S. Pat. No. 4,628,264, incorporated herein by reference in its entirety, whole-body coil 12 generates a static main magnetic field, and gradient coils 14, 15, 16 (shown diagrammatically surrounding a subject body 18) provide magnetic field gradients $G_x$, $G_y$, and $G_z$ in the respective x, y, and z gradient coil directions. Gradient coils 14, 15, 16 are driven by respective amplifiers 20, 22, 24, each of which is connected directly to its associated coil 14, 15, 16. A gradient coil waveform generator 25 drives amplifiers 20, 22, 24. If necessary or desired to achieve faster slew rates of the gradient magnetic fields, resonant power supplies (RPS) can be used instead of amplifiers 20, 22, 24. RPSs are disclosed in above-mentioned U.S. Pat. No. 4,628,264 (parallel RPS) or U.S. Pat. No. 5,285,161 (series RPS), incorporated herein by reference in its entirety.

An RF coil 26 also surrounds subject body 18. RF coil 26, which is connected to an R2F transmitter/receiver 28, transmits an RF magnetic signal to excite nuclei in subject body 18, and also receives the RF resonance signals emitted by the excited nuclei. Signals received by RF receiver 28 are provided to a data processor 29. A localized RF coil (e.g., an RF coil that surrounds the particular body region to be imaged) or an RF coil phased array can be used instead of or in addition to whole-body RF coil 26.

Data Acquisition

Figure 4:
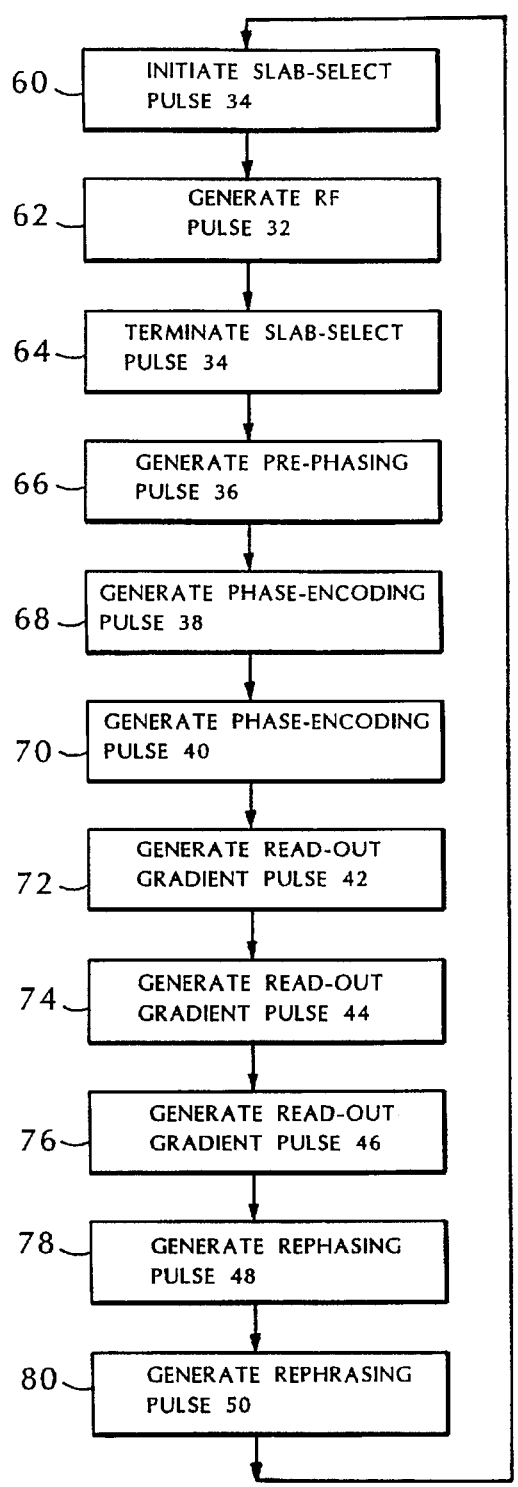
FIG. 4 is a block diagram showing steps for generating the MRI sequence shown in FIG. 2.

An RF and gradient waveform timing diagram 30 for MRI system 10 is shown in FIG. 2, and the steps for producing the pulse sequence shown in timing diagram 30 are shown in FIG. 4. The pulse sequence shown in timing diagram 30 is repeated many times in succession to acquire three raw data matrices $M1_{raw}$, $M2_{raw}$, $M3_{raw}$, each e.g., 256×128×64 data points (each data point in matrices $M1_{raw}$, $M2_{raw}$, $M3_{raw}$ is a complex data value stored as its real and imaginary components). These matrices are processed as described below to generate two images, one showing the distribution of fat tissue in the field of view of subject body 18, and the other showing water.

To excite nuclei in a desired slice of subject body 18, gradient waveform generator 25 and RF transmitter/receiver 28 (FIG. 1) are used to generate simultaneously an RF "excitation" (or "nutation") pulse 32 and a "slab-select" gradient pulse 34, e.g., in the z direction (steps 60, 62, 64). (In two-dimensional imaging, a "slice select" gradient pulse is generated during the RF excitation pulse.) RF pulse 32 is typically a, e.g., 30°–60° nutation angle to provide good image contrast.

Prephasing (or dephasing) gradient pulse 36 and phase-encode pulses 38, 40 are then generated using gradient waveform generator 25 (FIG. 1) in the respective x, y, and z directions (steps 66, 68, 70). The amplitudes of pulses 36, 38, 40 are selected to center each of the raw data matrices $M1_{raw}$, $M2_{raw}$, $M3_{raw}$ in the three-dimensional K-space. Specifically, 256 data points are collected for one row of each raw data matrix by generating, using gradient waveform generator 25, three successive read-out gradient pulses 42, 44, 46 in the x-direction (steps 72, 74, 76). To center those rows in the K-space, the integral of prephasing pulse 36 is one-half the magnitude of the integral of each of read-out pulses 42, 44, 46.

Phase encode pulses 38, 40 are similarly used to center the y and z dimensions of the raw data matrices in the K-space. The integrals of pulses 38, 40 correlate to the y and z coordinates, respectively, of the rows of data acquired during read-out pulses 42, 44, 46. In the first application of the pulse sequence shown in timing diagram 30, the integrals of both the y and the z phase-encode pulses 38, 40 are negative, corresponding to an edge of the k-space. After read-out pulses 42, 44, 46 have been generated, rephasing pulses 48, 50 are generated (using gradient waveform generator 25) in the y and z directions that are equal in magnitude and opposite in sign to phase-encode pulses 38, 40 (steps 78, 80).

In the second application of the pulse sequence, z phase-encode pulse 40 is identical to the pulse 40 generated in the first application, but the integral of y phase-encode pulse 38 is increased incrementally (i.e., the pulse becomes less negative). Y phase-encode pulse 38 is incremented in this manner in subsequent applications, until the pulse is equal in magnitude and opposite in sign to the y phase-encode pulse 38 generated in the first application (e.g., after 128 applications of the pulse sequence). In the next (e.g., 129th) application of the pulse sequence shown in timing diagram 30, the integral of y phase-encode pulse 38 is again at its negative-most value, but the integral of z phase-encode pulse 40 is increased incrementally. The y phase-encode pulse 38 is then again incremented throughout its value range in subsequent sequences. In this manner, raw data for matrices $M1_{raw}$, $M2_{raw}$, $M3_{raw}$ are collected row-by-row, plane-by-plane, in raster-scan fashion. The pulse sequence shown in timing diagram 30 is thus repeated n times, where n is the product of the y and z dimensions (e.g., 128×64, or 8192) of the raw data matrices.

The "center position" of each of read-out pulses 42, 44, 46 is a function of both the average strength of the magnetic field $B_0$ generated by whole-body coil 12 and the chemical shift difference $\Delta$ between the two species of interest, here fat and water. The center position of a read-out gradient pulse is the point at which the integral of the pulse is one-half the total integral of the pulse, e.g., where an RF echo (echo 1, echo 2, echo 3) occurs. Because of their different Larmor frequencies, a nucleus of one of the species (here fat) spins faster than a nucleus of the other when both are subjected to a magnetic field of the same strength:

$$T = \frac{1}{\Delta B_0 \gamma} \quad (2)$$

where T is the time necessary for the faster-spinning species to rotate once with respect to the slower species. For fat and water species, where $\gamma$ is 42.58 MHz/Tesla and $\Delta$ is 3.5 ppm, T equals 13.4 milliseconds in a 0.5 Tesla field. The pulse duration is a function of the sampling rate and the number of points sampled per read-out pulse (e.g., 256). The pulse amplitude is a function of the field of view in the x direction.

The center of read-out pulse 42 occurs T seconds after the center of RF pulse 32. As shown in FIGS. 3A and 3B, at the center of RF pulse 32, the phase difference between a water nucleus 52 and an immediately adjacent fat nucleus 54 is zero. T seconds later fat nucleus 54 has rotated once with respect to water nucleus 52, so the phase difference between the two is again zero (i.e., the two are in-phase). Data sampled during read-out pulse 42 by RF receiver 28 (FIG. 1) are stored in raw data matrix $M1_{raw}$.

The center of read-out pulse 44 occurs 2 seconds ½T after the center of read-out pulse 42. In this interval, fat nucleus 54 has precessed only 180° with respect to water nucleus 52 (i.e., the two are 180° out-of-phase), as shown in FIGS. 3A and 3B. Data sampled during read-out pulse 44 by RF receiver 28 (FIG. 1) are stored in raw data matrix $M2_{raw}$.

The center of read-out pulse 46 occurs ½T seconds after the center of read-out pulse 44 (and thus T seconds after the center of read-out pulse 42). Because it has precessed another 180° with respect to water nucleus 52 in this interval, fat nucleus 54 is again in-phase with the water nucleus. Data sampled during read-out pulse 46 by RF receiver 28 (FIG. 1) are stored in raw data matrix $M3_{raw}$.

In a typical MRI system 10 (FIG. 1), when subject body 18 is in place, the magnetic field $B_0$ generated by whole-body coil 12 is inhomogeneous, i.e., the strength of magnetic field $B_0$ varies spatially over the image region. Thus, at various points in subject body 18, the local magnetic field strength can be higher or lower than the average strength of field $B_0$. Because of these variations, the fat and water nuclei can spin at slightly higher or lower frequencies than expected, depending on their location in subject body 18. However, the relative phase difference between fat and water nuclei at the same location in subject body 18 is essentially unaffected by such variations in local magnetic field strength.

This phenomenon is illustrated in FIGS. 3C and 3D. In this example, water nucleus 52 and fat nucleus 54 are located in a region with a local magnetic field that is slightly stronger than the average strength of the $B_0$ field. Because the spin frequency is slightly higher than expected (see equation (2)), at T seconds after the center of RF pulse 32 there is a relative phase shift $\phi$ between these nuclei and nuclei subjected to a magnetic field equal to the average strength of the $B_0$ field (see FIGS. 3A and 3B). As in the case where nuclei 52 and 54 are subjected to a homogeneous field, there is essentially no phase shift at this time between water nucleus 52 and fat nucleus 54, as shown in FIGS. 3C and 3D (i.e., nuclei 52 and 54 in an inhomogeneous field are substantially in-phase T seconds after the center of RF pulse 32). Phase shift $\phi$ is a function of the variation in local field strength relative to the average field strength. This inhomogeneity typically introduces a first-order (linear) phase error, and so the phase shift increases to 1½$\phi$ by the center of pulse 44 (when nucleus 52 and fat nucleus 54 are substantially 180° out-of-phase), and 2$\phi$ by the center of pulse 46 (when nucleus 52 and fat nucleus 54 are again substantially in-phase).

Data Processing

Figure 5:
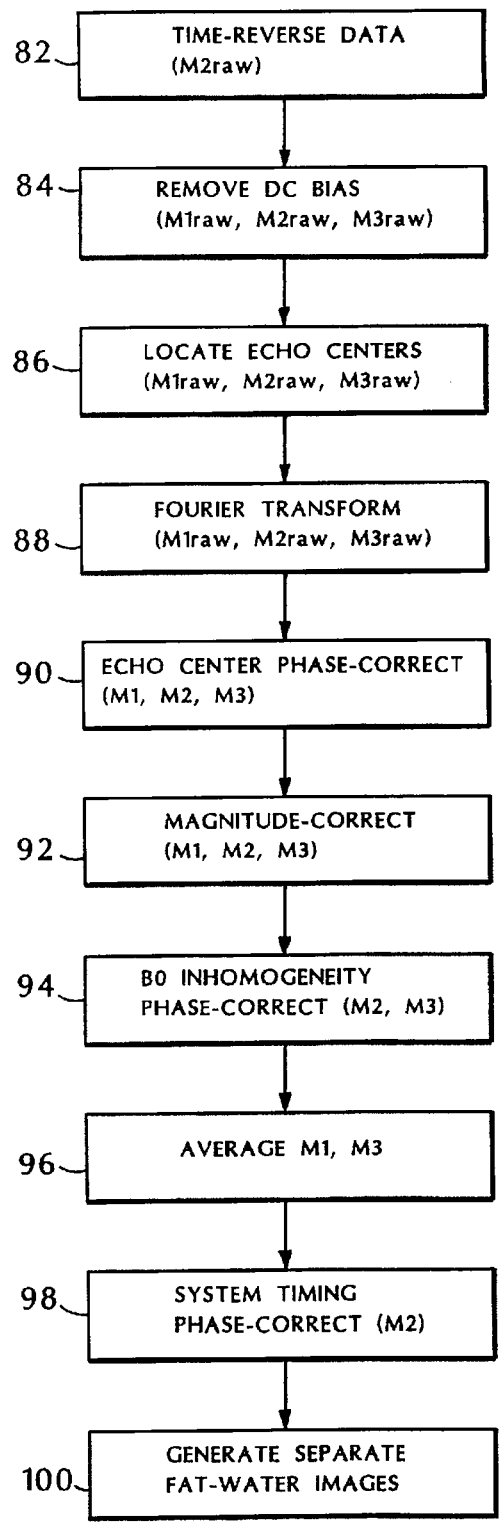
FIG. 5 is a block diagram showing steps for processing data acquired during the MRI sequence shown in FIG. 2.

After all raw data have been acquired, raw data matrices $M1_{raw}$, $M2_{raw}$, $M3_{raw}$ are processed by data processor 29 (FIG. 1) using, e.g., a digital microprocessor and associated memory and other circuitry to run the process disclosed in the microfiche appendix hereto. This process includes ten principal steps, shown in FIG. 5 and described below.

1. Time-reverse the data in the $M2_{raw}$ matrix. (Step 82)

The data in the $M2_{raw}$ matrix were collected during negative read-out gradient pulse 44, while moving from right-to-left across the K-space. The data in the $M1_{raw}$ and $M3_{raw}$ matrices were collected during positive read-out gradient pulses 42 and 46, while moving from left-to-right across the K-space. So that the data in all three matrices correlate to the same points in K-space, the rows of data in the $M2_{raw}$ matrix are transposed, or time-reversed.

2. Remove DC bias from the data in the $M1_{raw}$, $M2_{raw}$, and $M3_{raw}$ matrices. (Step 84)

DC bias can be introduced into the raw data from several sources, including the analog-to-digital converters (not shown) in RF transmitter/receiver 28, which sample and digitize the analog signal sensed by RF coil 26. Because the lowest signal energy is found in the corners of the raw data matrices, the data in these corners are averaged and the average value (which is presumed to reflect the DC bias) subtracted from the rest of the data.

Specifically, for each plane of each matrix (a plane comprises the locus of data points in which the z coordinate is constant), the process averages the data stored in the 16×16 data points at each of the four corners of the plane (i.e., a total of 1024 points) to get a single DC offset value for that plane. The DC offset value is then subtracted from all data points in the plane. The process is repeated for all planes in each of the raw data matrices.

3. Locate the echo centers of the $M1_{raw}$, $M2_{raw}$, and $M3_{raw}$ matrices. (Step 86)

Because of, e.g., difficulties in synchronizing the gradient and RF pulses and the data sampling, the RF echo (i.e., the point at which the RF signal is a maximum) usually does not lie in the center of the raw data matrix (e.g., at point (128, 64, 32) in a 256×128×64 point matrix).

The x, y, and z coordinates of the true "echo center" of each raw data matrix are located in three separate steps. To locate the z coordinate of the echo center, a submatrix is first defined that is centered around the center of the matrix. The submatrix is typically as deep in the z direction as the raw data matrix, but narrower and shorter than the raw data matrix in the x and y directions. For instance, the submatrix could be an 18×18×64 submatrix centered around point (128, 64, 32).

The magnitudes of the complex data in the submatrix are then calculated, and this magnitude data is filtered in the z direction using a "moving window" digital filter (e.g., a Sinc-Hamming filter). The highest filtered magnitude in the submatrix is then located, and a center of moment search around that point is used to determine the z coordinate of the echo center.

The plane containing the highest filtered magnitude in the submatrix is then processed to determine the positions of the x and y coordinates of the echo center. To determine the y coordinate, a subplane is defined that is centered around the center of the plane. The subplane is typically as long in the y direction as the raw data matrix, but narrower than the raw data matrix in the x direction. For instance, the subplane could be an 18×128 subplane centered around point (128, 64). As in the Calculation of the z coordinate of the raw data matrix, the magnitudes of the complex data in the subplane are filtered using a moving window digital filter. The highest filtered magnitude in the subplane is then located, and a center of moment search around that point is used to determine the y coordinate of the echo center.

To determine the x coordinate of the echo center, another subplane is defined that is centered around the center of the plane. This subplane is typically as wide in the x direction as the raw data matrix, but shorter than the raw data matrix in the y direction. For instance, the subplane could be an 256×18 subplane centered around point (128, 64). The magnitudes of the complex data in the subplane are filtered using a moving window digital filter. The highest filtered magnitude in the subplane is then located, and a center of moment search around that point is used to determine the x coordinate of the echo center.

This process is then repeated to determine the echo centers of the remaining two raw data matrices.

4. Separately process the $M1_{raw}$, $M2_{raw}$, and $M3_{raw}$ matrices using a three-dimensional fast Fourier transform to generate three image matrices M1, M3, and M3. (Step 88)

Image matrices M1, M2, and M3 define three separate images of the same region of subject body 18 (FIG. 1). A complex data pair M1(x,y,z), M2(x,y,z), M3(x,y,z) is stored at each address (x,y,z), or "pixel," in the matrices. For a given pixel $(x_0,y_0,z_0)$, data $M1(x_0,y_0,z_0)$, $M2(x_0,y_0,z_0)$, $M3(x_0,y_0,z_0)$ correspond to (i.e., reflect the composition of) the same location in subject body 18.

5. First-order phase-correct the delta in image matrices M1, M2, and M3. (Step 90)

If the echo centers calculated in step 3 are not located at the centers of the matrices then there is a first-order phase error in image matrices M1, M2, and M3.

This error is corrected by determining, for each raw data matrix, the distance between the matrix center and the echo center. For instance, in raw data matrix $M1_{raw}$, the echo center is shifted from the matrix center by $\Delta 1_x$, $\Delta 1_y$, and $\Delta 1_z$ in the x, y, and z directions, respectively. A $\Delta=1$ shift corresponds to $2\pi$ radians of phase-shift error distributed linearly across the data in the direction of the shift. To correct the first-order phase error, the phase of each data point M1(x,y,z) in the M1 matrix is shifted by $\phi(x,y,z)$ radians:

$$\Phi(x,y,z) = \qquad (3)$$

$$2\pi \left( \Delta 1_x \frac{x - \frac{1}{2} n_x}{n_x} + \Delta 1_y \frac{y - \frac{1}{2} n_y}{n_y} + \Delta 1_z \frac{z - \frac{1}{2} n_z}{n_z} \right)$$

where $n_x$, $n_y$, $n_z$ equal the number of points in the x, y, and z directions of the matrix (e.g., 256, 128, and 64, respectively). The process is then repeated for matrices M2 and M3.

6. Magnitude-correct the data in image matrices M2 and M3. (Step 92)

After RF pulse 32 of the pulse sequence shown in timing diagram 30 (FIG. 2), the excited nuclei relax, a phenomenon termed "$T_2^*$ relaxation." Thus, the strength of the received RF signal decreases in successive read-out pulses 42, 44, 46, and the magnitude intensity of the images corresponding to the M1, M2, and M3 matrices decreases accordingly. This step in the process scales the data in matrices M2 and M3 so that the corresponding images have the same intensity as the image corresponding to the M1 matrix. To avoid scaling noise as well as signal, only those data points having a magnitude greater than the noise level are scaled.

The process assumes that $T_2^*$ relaxation proceeds exponentially with time as measured from the center of RF excitation pulse 32 (FIG. 2). If the volume of tissue corresponding to pixel (x,y,z) includes only a single species (i.e., if the volume consists exclusively of fat or exclusively of water), then the magnitude intensity |M2(x,y,z)| of the data at pixel (x,y,z) in the M2 matrix would be:

$$|M2(x,y,z)| = \sqrt{|M1(x,y,z)| \times |M3(x,y,z)|} \qquad (4)$$

because M2 (x,y,z) was sampled midway between M1 (x,y,z) and M3(x,y,z).

However, a particular volume can include both fat and water nuclei. As noted above, the fat and water nuclei are phase offset by up to 180° at the time the raw data for matrix M2 are sampled. Thus, the magnitude intensity |M2(x,y,z)| of the data at a pixel corresponding to a mixed fat-water volume is lower than if the volume were entirely fat or entirely water. To avoid over-correcting the intensity of the image corresponding to the M2 matrix, the magnitudes of data M2(x,y,z) are scaled in accordance with the values predicted by the exponential decay model. Specifically, the datum at each "non-noise" pixel (x,y,z) in the M2 matrix is scaled by a scale factor S(x,y,z) (i.e., the real and imaginary components of M2(x,y,z) are multiplied by S(x,y,z)):

$$S(x,y,z) = \sqrt{\frac{|M1(x,y,z)|}{|M3(x,y,z)|}} \qquad (5)$$

The magnitude of the M3 matrix is also corrected. Even in a perfectly homogeneous field where the phase difference between the fat and water nuclei is the same during read-out pulse 42 as it is during read-out pulse 46 (FIG. 2), the magnitude of the data at a given pixel in the M1 matrix will be greater than the magnitude of the data at the same pixel in the M3 matrix, as the latter was sampled T seconds after the former. The intensity of the image corresponding to matrix M3 is corrected by scaling the magnitude of the data |M3(x,y,z)| at each "non-noise" pixel in the matrix to equal the magnitude of the data |M1(x,y,z)| at the same pixel in matrix M1.

7. Phase-correct the data in image matrices M2 and M3 to correct for phase errors attributable to inhomogeneities in the $B_0$ field. (Step 94)

As noted above, inhomogeneities in the $B_0$ field can introduce unexpected phase shifts between fat and water nuclei, as shown in FIGS. 3A, 3B, 3C, and 3D. The process assumes that this phase error is linear in time, and thus the relative phase shift $\phi(x_0,y_0,z_0)$ between the data $M1(x_0,y_0,z_0)$, $M3(x_0,y_0,z_0)$ at pixel $(x_0,y_0,z_0)$ in the M1 and M3 matrices is twice the relative phase shift $\frac{1}{2}\phi(x_0,y_0,z_0)$ between the data $M1(x_0,y_0,z_0)$, $M2(x_0,y_0,z_0)$ at the same pixel in the M1 and M2 matrices.

A matrix comprising the $\phi(x,y,z)$ data is first generated by determining the relative phase shift between the data M1(x,y,z), M3(x,y,z) at each pixel in the respective M1 and M3 matrices. Phase error in matrix M3 is corrected by subtracting $\phi(x,y,z)$ from the data in the matrix.

All data in the $\phi(x,y,z)$ matrix lie between −180° and 180°. There therefore may be discontinuities in the phase shift data, where the phase shift jumps from around 180° at one point in the matrix to around −180° at an adjacent point in the matrix. For instance, the phase shift data in a successive sequence of points in x direction of the $\phi(x,y,z)$ matrix could be 171°, 175°, 179°, 179°, −177°, −173°. Because inhomogeneities in the $B_0$ field typically vary smoothly, the "true" phase shift of the latter two points is likely 183° and 187°, respectively Because of this discontinuity, the data in the $\phi(x,y,z)$ matrix may not reflect the true phase shift between M1(x,y,z) and M3(x,y,z). Although a discontinuity would not affect the phase correction of matrix M3, it would result in a 180° phase error in one or more data values M2(x,y,z) in matrix M2. For instance, if the phase difference between $M1(x_0, y_0,z_0)$ and $M3(x_0,y_0$ $z_0)$ were in fact 330° it would nonetheless be stored at $\phi(x_0,y_0,z_0)$ as −30°. Because subtracting −30° from $M3(x_0,y_0,z_0)$ is the same as subtracting 330°, this "error" does not affect the phase correction of matrix M3. However, the data in the $\phi(x,y,z)$ matrix cannot simply be halved and subtracted from the data in the M2 matrix, because subtracting −15° from M2($x_0,y_0,z_0$) is not the same as subtracting 165°, and in fact results in a 180° phase error.

The data in the $\phi(x,y,z)$ matrix are therefore preprocessed prior to being halved and subtracted from the M2($x,y,z$) data in the M2 matrix. The preprocessing step assumes that $B_0$ field inhomogeneities vary smoothly throughout the image region. Starting at the leftmost point $\phi(1,y,z)$ of each row in the $\phi(x,y,z)$ matrix, the process compares adjacent points. If the difference between the phase-shift value at the point under consideration ($\phi(n,y,z)$) and the value at the preceding point ($\phi(n-1,y,z)$) is less than −180°, then 360° is added to the point under consideration and all remaining points in the row (i.e., to points $\phi(n,y,z)$, $\phi(n+1,y,z)$, . . . , $\phi(n_x,y,z)$, where $n_x$ equals the number of points in the x directions of the matrix). If the difference between the phase-shift value at the point under consideration and the value at the preceding point is greater than +180°, then 360° is subtracted from the point under consideration and all remaining points in the row. The process then continues to evaluate the remaining points in the row using the same logic, and then repeats the process for all rows in the $\phi(x,y,z)$ matrix. Thus preprocessed, the $\phi(x,y,z)$ matrix is then halved and subtracted from the data in the M2 matrix.

8. Average the M1 and M3 matrices to generate an averaged image matrix M13. (Step 96)

Because noise is not correlated, averaging the matrices in this manner reduces noise by the square root of 2.

9. Phase-correct the data in image matrix M2 to correct for phase errors attributable to system timing-related imperfections. (Step 98)

These imperfections result from, e.g., the fact that readout pulse 44 is negative, and thus traverses the K-space in a direction opposite read-out pulses 42, 46.

The process assumes that such system timing-related imperfections manifest themselves as a linear phase differential between the predicted phase of the data and the actual, observed phase of that point. For each row of data in matrix M2 (e.g., M2($x,y_0,z_0$), where x is the set of points from 1 to $n_x$), the process calculates this difference. The process then scans the row for the longest continuous sequence of phase differentials (i.e., the longest sequence of phase differentials in which no two adjacent differentials are more than 180° apart).

Because the phase error is presumed to be linear (i.e., first-order error) over the row, the first and last points of the sequence are subtracted and divided by the number of points in the sequence to determine the slope A of the phase error across the entire row. Using this slope and one of the points in the sequence to find the intercept B, the phase error is extrapolated across the entire row. (E.g., the phase error of data value M2($x,y_0,z_0$) at pixel ($x,y_0,z_0$) equals Ax+B.) The appropriate extrapolated phase error value is then subtracted from the each data value in the row.

10. Generate separate fat and water images. (Step 100)

One image is generated by adding matrices M13 and M2, and the other by subtracting the matrices. One of the images is of the fat tissue in the excited slice, the other is of the water. Although it is not always possible to determine a priori which image will be fat and which will be water, it is in any event generally possible to ascertain from the different structures depicted in the two images which is which. In addition, a reference marker, either of fat or water, could be inserted adjacent the tissue prior to imaging. The presence or absence of this marker in an image could then be used to determine whether the image is of fat- or water-bearing tissue.

Other embodiments are within the scope of the following claims.

For example, the above-described method and apparatus can be used to generate separate images of any two or more species that have close, but non-identical, Larmor frequencies. For instance, the Larmor frequency of a silicon nucleus is approximately 4.5 ppm greater than a water nucleus. Generating separate images of these two species would facilitate ready, non-invasive diagnosis of, e.g., leaking breast implants. The method and apparatus can also be used in one- and two-dimensional imaging.

In addition, more than three read-out pulses could be generated between successive RF excitation pulses. The centers of the additional read-out pulses could be located so as to coincide with the in-phase and 180° out-of-phase timing of the fat and water nuclei. The data collected during these read-out pulses could be used for further processing of the raw data and/or image matrices, e.g., for higher-order phase and magnitude correction. The data could additionally or alternatively be used to generate separate images of more than two species (e.g., fat, water, and silicon).

The centers of the read-out gradient pulses need not coincide with the times at which the species of interest are in-phase and 180° out-of-phase with respect to one another. Rather, the centers can respectively coincide with any two or more known relative phase offsets between the two species. (E.g., the centers of the first, second, and third pulses can coincide with the times at which the relative phase offsets between the two species are 10°, 150°, and −15°, respectively.)

Data are then processed in accordance with these known relative phase offsets. For instance, image matrices M1, M2, M3, which correspond to the raw data acquired during the first, second, and third read-out gradient pulses, can be processed in accordance with, e.g., the respective cosines of the relative phase offsets at the centers of the pulses. (E.g., in the embodiment set forth above where the relative phase offsets at the centers of the first and second pulses are 0° and 180°, image matrix M1 is processed by multiplying it by the cosine of 0° (i.e., 1), and image matrix M2 is processed by multiplying it by the cosine of 180° (i.e., −1).) Thus processed, the image matrices can be added and subtracted in the manner described above to generate separate images of the species.

As noted, in MRI there is a correlation between the spin frequency of a nucleus and the position of the image of that nucleus in the resultant image. Thus, if only a single image is generated, immediately adjacent nuclei of two different species can appear shifted with respect to one another. For instance, in a single image of a breast, fat and water could appear superimposed and shifted with respect to one another. The degree of this shift increases as the strength of the $B_0$ field increases. To generate a single image that more faithfully depicts the true distribution of species in the imaging region, separate images could first be generated using the method and apparatus set forth above. The images could then be "manually" shifted with respect to one another to account for the chemical shift difference, and combined into a single image.

What is claimed is:

1. A method for generating a magnetic resonance image of a region comprised of a first species of nuclei having a first Larmor frequency and a second species of nuclei having a second Larmor frequency different from said first Larmor frequency, said method comprising:

generating a RF excitation pulse for exciting said first species of nuclei and said second species of nuclei in said region;

generating a phase-encoding magnetic gradient pulse after generating said RF excitation pulse;

generating a first read-out magnetic gradient pulse after generating said RF excitation pulse and said phase-encoding magnetic gradient pulse and before generating another RF excitation pulse and another phase-encoding magnetic gradient pulse, nuclei of said first and second species having a first relative phase offset at the center of said first read-out gradient pulse;

generating a second read-out magnetic gradient pulse after generating said RF excitation pulse and said phase-encoding magnetic gradient pulse and before generating another RF excitation pulse and another phase-encoding magnetic gradient pulse, nuclei of said first and second species having a second relative phase offset at the center of said second read-out gradient pulse, said second relative phase offset being different from said first relative phase offset;

generating a third read-out magnetic gradient pulse after generating said RF excitation pulse and said phase-encoding magnetic gradient pulse and before generating another RF excitation pulse and another phase-encoding magnetic gradient pulse, nuclei of said first and second species having a third relative phase offset at the center of said third read-out gradient pulse, said third relative phase offset being different from said second relative phase offset;

acquiring RF resonant signals emitted by excited first and second species of nuclei during said first read-out gradient pulse, said second read-out gradient pulse, and said third read-out gradient pulse; and processing RF resonant signals acquired in said acquiring step to generate a magnetic resonant image, said processing step including the substep of phase-correcting data used to generate said magnetic resonance image.

2. A method as recited in claim 1 wherein said first relative phase offset is substantially zero.

3. A method as recited in claim 1 wherein said second relative phase offset is substantially 180°.

4. A method as recited in claim 1 wherein said step of acquiring RF resonant signals comprises the substeps of sampling and digitizing said RF resonant signals.

5. A method as recited in claim 4 wherein said step of acquiring RF resonant signals comprises the substep of storing digitized RF resonant signals in a first raw data matrix during said first read-out gradient pulse, in a second raw data matrix during said second read-out gradient pulse, and in a third raw data matrix during said third read-out gradient pulse.

6. A method as recited in claim 1 wherein said processing step includes the substep of time-reversing at least some of said RF resonant signals.

7. A method as recited in claim 1 wherein said processing step includes the substep of removing DC bias from said RF resonant signals.

8. A method as recited in claim 1 wherein said processing step includes the substep of Fourier transforming said RF resonant signals to generate image signals.

9. A method as recited in claim 8 wherein said processing step includes the substep of magnitude-correcting said image signals.

10. A method as recited in claim 8 wherein said image signals are the data subjected to said phase-correcting substep.

11. A method as recited in claim 10 wherein said processing step includes the substep of locating echo centers in said RF resonant signals.

12. A method as recited in claim 11 wherein said image signals are phase-corrected in accordance with the locations of said echo centers.

13. A method as recited in claim 10 wherein said image signals are phase-corrected in accordance with magnetic field inhomogeneities.

14. A method as recited in claim 10 wherein said image signals are phase-corrected in accordance with time-artifact inhomogeneities.

15. A method as recited in claim 1 wherein said magnetic resonance image is substantially free of depictions of said second species of nuclei.

16. A method as recited in claim 15 wherein said processing step generates a second magnetic resonance image substantially free of depictions of said first species of nuclei.

17. A method as recited in claim 1 wherein said first read-out gradient pulse is generated before said second read-out gradient pulse.

18. A method as recited in claim 1 wherein said third relative phase offset is substantially equal to said first relative phase offset.

19. A method as recited in claim 1 wherein said third relative phase offset is substantially zero.

20. Apparatus for generating a magnetic resonance image of a region comprised of a first species of nuclei having a first Larmor frequency and a second species of nuclei having a second Larmor frequency different from said first Larmor frequency, said apparatus comprising:

means for generating a RF excitation pulse for exciting said first species of nuclei and said second species of nuclei in said region;

means for generating a phase-encoding magnetic gradient pulse after generating said RF excitation pulse;

means for generating a first read-out magnetic gradient pulse after said RF excitation pulse and said phase-encoding magnetic gradient pulse are generated and before another RF excitation pulse and another phase-encoding magnetic gradient pulse are generated, nuclei of said firsthand second species having a first relative phase offset at the center of said first read-out gradient pulse;

means for generating a second read-out magnetic gradient pulse after said RF excitation pulse and said phase-encoding magnetic gradient pulse are generated and before another RF excitation pulse and another phase-encoding magnetic gradient pulse are generated, nuclei of said first and second species having a second relative phase offset at the center of said second read-out gradient pulse, said second relative phase offset being different from said first relative phase offset;

means for generating a third read-out magnetic gradient pulse after said RF excitation, pulse and said phase-encoding magnetic gradient pulse are generated and before another RF excitation pulse and another phase-encoding magnetic gradient pulse are generated, nuclei of said first and second species having a third relative phase offset at the center of said third read-out gradient pulse, said third relative phase offset being different from said second relative phase offset;

means for acquiring RF resonant signals emitted by excited first and second species of nuclei during said first read-out gradient pulse, said second read-out gradient pulse, and said third read-out gradient pulse; and means for processing RF resonant signals acquired by said acquiring means to generate a magnetic resonant image, said means for processing including a means for phase-correcting data used to generate said magnetic resonance image.

21. A method for generating a magnetic resonance image of a region comprised of fat nuclei having a Larmor frequency of $f_f$ in Hertz and water nuclei having a Larmor frequency of $f_w$ in Hertz, said method comprising:

generating a first RF excitation pulse for exciting said fat and water nuclei in said region, said first RF excitation pulse having an center;

generating a phase-encoding magnetic gradient pulse after generating said first RF excitation pulse;

generating a first read-out magnetic gradient pulse after generating said first RF excitation pulse and said phase-encoding magnetic gradient pulse and before generating another RF excitation pulse and another phase-encoding magnetic gradient pulse, fat and water nuclei being substantially in-phase with respect to one another at the center of said first read-out gradient pulse;

generating a second read-out magnetic gradient pulse after generating said first read-out gradient pulse and before generating another RF excitation pulse and another phase-encoding magnetic gradient pulse, fat and water nuclei being substantially 180° out-of-phase with respect to one another at the center of said second read-out gradient pulse;

generating a third read-out magnetic gradient pulse after generating said second reed-out gradient pulse and before generating another RF excitation pulse and another phase-encoding magnetic gradient pulse, fat and water nuclei being substantially in-phase with respect to one another at the center of said third read-out gradient pulse;

acquiring RF resonant signals emitted by excited first and second species of nuclei during said first read-out gradient pulse, said second read-out gradient pulse, and said third read-out gradient pulse;

transforming said RF resonant signals to generate image data;

phase-correcting at least some of said image data; and generating a magnetic resonant image from at least some of said image data after said phase-correcting step.

22. A method as recited in claim 21 wherein said center of said first read-out gradient pulse occurs substantially $N/(f_f-f_w)$ seconds after said center of said first RF excitation pulse, where N is a positive integer.

23. A method as recited in claim 21 wherein said center of said second read-out gradient pulse occurs substantially $(M+\frac{1}{2})/(f_f-f_w)$ seconds after said center of said first RF excitation pulse, where M is a positive integer.

24. A method as recited in claim 23 wherein said center of said third read-out gradient pulse occurs substantially $(P+\frac{1}{2})/(f_f-f_w)$ seconds after said center of said second read-out gradient pulse, where P is a positive integer.

25. A method as recited in claim 21 wherein said center of said third read-out gradient pulse occurs substantially $Q/(f_f-f_w)$ seconds after said center of said first RF excitation pulse, where Q is a positive integer.

26. A method as recited in claim 1 wherein said processing step includes the substep of processing RF resonant signals acquired in said acquiring step in accordance with said first relative phase offset, said second relative phase offset, and said third relative phase offset.

27. A method as recited in claim 1 wherein said first species of nuclei comprise water hydrogen nuclei, and said second species of nuclei comprise fat hydrogen nuclei.

* * * * *

UNITED STATES PATENT AND TRADEMARK OFFICE
CERTIFICATE OF CORRECTION

PATENT NO. : 5,627,469

DATED : May 6, 1997

INVENTOR(S) : Xiaole Hong; Douglas A. C. Kelley; Jianyu Lian; Peter B. Roemer; and Robert M. Weisskoff Page 1 of 2

It is certified that error appears in the above-identified patent and that said Letters Patent is hereby corrected as shown below:

Cover page, [56] References Cited, U.S. PATENT DOCUMENTS, at "4,871,967", "Rotem" should be --Rotem et al.--.

Column 2, line 17, after "invention", delete ",".

Column 3, line 36, "R2F" should be --RF--.

Column 5, line 10, after "occurs", delete "2 seconds".

Column 5, line 10, after "1/2T", insert --seconds--.

Column 5, line 15, after "pulse", delete ".".

Column 6, line 56, "Calculation" should be --calculation--.

Column 7, line 10, "M3" should be --M2--. (1st occurrence).

Column 7, line 17, "delta" should be --data--.

Column 8, line 52, delete second occurrence of "179°,".

Column 8, line 55, after "respectively", insert --.--.

UNITED STATES PATENT AND TRADEMARK OFFICE
CERTIFICATE OF CORRECTION

PATENT NO. : 5,627,469
DATED : May 6, 1997
INVENTOR(S) : Xiaole Hong; Douglas A. C. Kelley; Jianyu Lian; Peter B. Roemer; and Robert M. Weisskoff It is certified that error appears in the above-identified patent and that said Letters Patent is hereby corrected as shown below:

Column 8, line 62, after "330°", insert --,--.

Column 12, line 36, "firsthand" should be --first and--.

Column 12, line 49, after "excitation", delete ",".

Column 13, line 24, "reed-out" should be --read-out--.

Signed and Sealed this

Twenty-third Day of December, 1997

Attest:

BRUCE LEHMAN

Attesting Officer

Commissioner of Patents and Trademarks